(12) United States Patent
Li et al.

(10) Patent No.: US 7,723,729 B2
(45) Date of Patent: May 25, 2010

(54) COMPOUND SEMICONDUCTOR-ON-SILICON WAFER WITH A SILICON NANOWIRE BUFFER LAYER

(75) Inventors: Tingkai Li, Vancouver, WA (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 272 days.

(21) Appl. No.: 12/036,396

(22) Filed: Feb. 25, 2008

(65) Prior Publication Data
US 2008/0149941 A1 Jun. 26, 2008

Related U.S. Application Data

(60) Division of application No. 11/481,437, filed on Jul. 6, 2006, now Pat. No. 7,358,160, which is a continuation-in-part of application No. 11/443,144, filed on May 30, 2006, now abandoned.

(51) Int. Cl.
*H01L 31/0312* (2006.01)
*H01L 29/20* (2006.01)
*H01L 29/06* (2006.01)

(52) U.S. Cl. .................. 257/77; 257/615; 257/618; 257/E27.112

(58) Field of Classification Search .......... 257/77, 257/615, 618, E27.112
See application file for complete search history.

(56) References Cited

U.S. PATENT DOCUMENTS

| | | | |
|---|---|---|---|
| 7,358,160 B2 * | 4/2008 | Li et al. ................. | 438/478 |
| 2003/0127960 A1 * | 7/2003 | Jeong et al. ............. | 313/309 |
| 2007/0031317 A1 * | 2/2007 | Akamatsu et al. ....... | 423/447.1 |

* cited by examiner

*Primary Examiner*—Evan Pert
(74) *Attorney, Agent, or Firm*—Law Office of Gerald Maliszewski; Gerald Maliszewski

(57) ABSTRACT

A compound semiconductor-on-silicon (Si) wafer with a Si nanowire buffer layer is provided, along with a corresponding fabrication method. The method forms a Si substrate. An insulator layer is formed overlying the Si substrate, with Si nanowires having exposed tips. Compound semiconductor is selectively deposited on the Si nanowire tips. A lateral epitaxial overgrowth (LEO) process grows compound semiconductor from the compound semiconductor-coated Si nanowire tips, to form a compound semiconductor layer overlying the insulator. Typically, the insulator layer overlying the Si substrate is a thermally soft insulator (TSI), silicon dioxide, or $Si_xN_y$, where $x \leq 3$ and $Y \leq 4$. The compound semiconductor can be GaN, GaAs, GaAlN, or SiC. In one aspect, the Si nanowire tips are carbonized, and SiC is selectively deposited overlying the carbonized Si nanowire tips, prior to the selective deposition of compound semiconductor on the Si nanowire tips.

9 Claims, 4 Drawing Sheets

ETCHING PROCESSES

CVD GROWTH

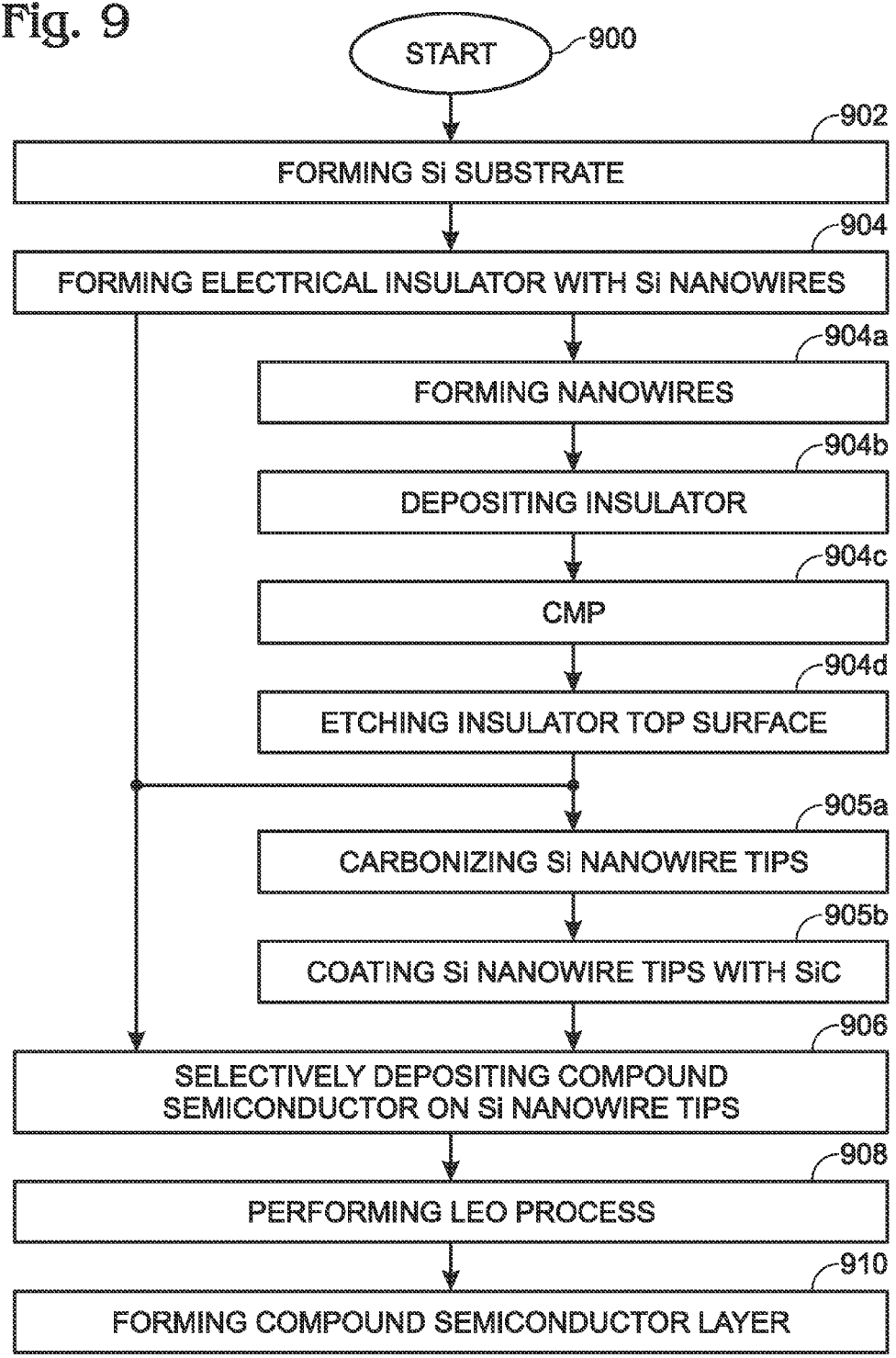

COMPOUND SEMICONDUCTOR-ON-SILICON WAFER WITH A SILICON NANOWIRE BUFFER LAYER

RELATED APPLICATIONS

This application is a Divisional of a patent application entitled, METHOD OF SELECTIVE FORMATION OF COMPOUND SEMICONDUCTOR-ON-SILICON WAFER WITH SILICON NANOWIRE BUFFER LAYER, invented by Tingkai Li et al., Ser. No. 11/481,437, filed Jul. 6, 2006, now U.S. Pat. No. 7,358,160;

which is a Continuation-in-part of a patent application entitled, COMPOUND SEMICONDUCTOR-ON-SILICON WAFER WITH A THERMALLY SOFT INSULATOR, invented by Hsu et al., Ser. No. 11/443,144, filed May 30, 2006, now abandoned. Both the above-mentioned applications are incorporated herein by reference.

BACKGROUND OF THE INVENTION

1. Field of the Invention

This invention generally relates to integrated circuit (IC) fabrication and, more particularly, to a wafer that uses a silicon nanowire buffer layer to insulate a compound semiconductor from thermally-induced lattice mismatches with an underlying silicon (Si) substrate.

2. Description of the Related Art

Gallium nitride (GaN) is a Group III/Group V compound semiconductor material with wide bandgap (3.4 eV), which has optoelectronic, as well as other applications. Like other Group III nitrides, GaN has a low sensitivity to ionizing radiation, and so, is useful in solar cells. GaN is also useful in the fabrication of blue light-emitting diodes (LEDs) and lasers. Unlike previous indirect bandgap devices (e.g., silicon carbide), GaN LEDs are bright enough for daylight applications. GaN devices also have application in high power and high frequency devices, such as power amplifiers.

GaN LEDs are conventionally fabricated using a metalorganic chemical vapor deposition (MOCVD) for deposition on a sapphire substrate. Silicon carbide (SiC) substrates are also used due to their relatively small lattice constant mismatch. However, these substrates are are expensive to make, and their small size also drives fabrication costs. For example, the state-of-the-art sapphire wafer size is only about 4 inches. To minimize costs, it would be desirable to integrate GaN device fabrication into more conventional Si-based IC processes, which has the added cost benefit of using large-sized (Si) wafers.

Silicon attracted attention as a substrate material for GaN growth when the first molecular beam epitaxy (MBE) grown GaN LED on Si was demonstrated in 1998. This work also demonstrated that p-type doping was achievable in GaN. Nevertheless, until recently, the properties of GaN-on-Si devices have been poor. For example, the full wave at half maximum (FWHM) of an X-ray rocking curve for GaN-on-Si may be 1000 arc s, whereas the measurement for a comparable GaN-on-SiC device may be 250-300 arc s. The photoluminescence spectra of the films grown on Si also show peak broadening.

There are two fundamental problems associated with GaN-on-Si device technology. First, there is a lattice mismatch of almost 16% between Si and GaN. This problem can be addressed by using a buffer layer of AlN, InGaN, AlGaN, or the like, prior to the growth of GaN. The buffer layer provides a transition region between the GaN and Si.

However, an additional and more serious problem exists, as there is also a thermal mismatch between Si and GaN. The thermal expansion coefficient mismatch between GaN and Si is about 54%. Although the lattice buffer layer may absorb part of the thermal mismatch, the necessity of using temperatures higher than 1000° C. during epi growth and other device fabrication may cause wafer deformation. The wafer deformation can be reduced with a very slow rate of heating and cooling during wafer processing but this adds additional cost to the process, and doesn't completely solve the thermal stress and wafer deformation issues. Patterning a substrate, by masking or etching the substrate or buffer layer, is an effective way to reduce lattice mismatch and thermally-induced stress or cracks. In this technique, a buffer layer, $Si_3N_4$ or $SiO_2$ for example, is deposited over a Si substrate in a patterned manner, or deep trenches are made on the masked materials. However, this solution adds additional fabrication steps to the process. Other solutions, which incompletely address the problem, involve the use of a doped buffer layer or superlattice structure.

It would be advantageous if the thermal and lattice mismatch problems associated with GaN-on-Si device technology could be practically eliminated without using slow heating and cooling processes, or complicated buffering structures.

SUMMARY OF THE INVENTION

The present invention relies upon a lateral epitaxial overgrowth (LEO) process to form a thick, high quality compound semiconductor film (e.g., GaN) on-Si wafer. It also has been demonstrated both theoretically and experimentally that additional stress relief results from the use of a nanosize nucleus. The 3-D strain in nanosize nucleus creates exponential stress/strain decay, with the decay length proportional to (and of similar magnitude to) the island diameter and, therefore, the strain energy saturates at a maximum value. A thick, high quality epitaxial compound semiconductor (e.g., epi-GaN) can be deposited on Si through nanosize nucleus technologies, using Si nanowire-on-silicon with, or without a Si-on-insulator (SOI) substrate. The Si nanowires are used to create nanosize growth island arrays, while the insulator (e.g., $SiO_2$ or $Si_xN_y$) provides selectivity during metalorganic chemical vapor deposition (MOCVD) growth. Other insulator materials include so-called "thermally soft insulators" (TSIs), which have a flow temperature lower than either the compound semiconductor or the Si substrate. The MOCVD process selectively grows compound semiconductor on the Si nanowires. Then, the LEO process is performed to promote the coalescence of crack-free, high quality compound semiconductor film on a Si substrate.

Accordingly, a method is provided for forming a compound semiconductor-on-Si wafer with a Si nanowire buffer layer. The method forms a Si substrate. An insulator layer is formed overlying the Si substrate, with Si nanowires having exposed tips. Compound semiconductor is selectively deposited on the Si nanowire tips. A LEO process grows compound semiconductor from the compound semiconductor-coated Si nanowire tips, to form a compound semiconductor layer overlying the insulator. Typically, the insulator layer overlying the Si substrate is a TSI, silicon dioxide, or $Si_xN_y$, where $x \leq 3$ and $Y \leq 4$. The compound semiconductor can be GaN, GaAs, GaAlN, or SiC.

In one aspect, insulator layer with Si nanowires is fabricated by initially forming Si nanowires overlying the Si substrate. The insulator is deposited over the Si nanowires, and a chemical-mechanical polish (CMP) is performed on the insulator top surface, stopping at Si nanowire tips. Then, the insulator top surface is etched, to expose the Si nanowire tips. In another aspect, the Si nanowire tips are carbonized, and SiC is selectively deposited overlying the carbonized Si nanowire tips, prior to the selective deposition of compound semiconductor on the Si nanowire tips.

Additional details of the above-described method, and compound semiconductor-on-silicon wafer with a Si nanowire buffer layer, are presented below.

BRIEF DESCRIPTION OF THE DRAWINGS

FIG. 9 is a flowchart illustrating a method for a compound semiconductor-on-Si wafer with a Si nanowire buffer layer.

DETAILED DESCRIPTION

Figure 1:
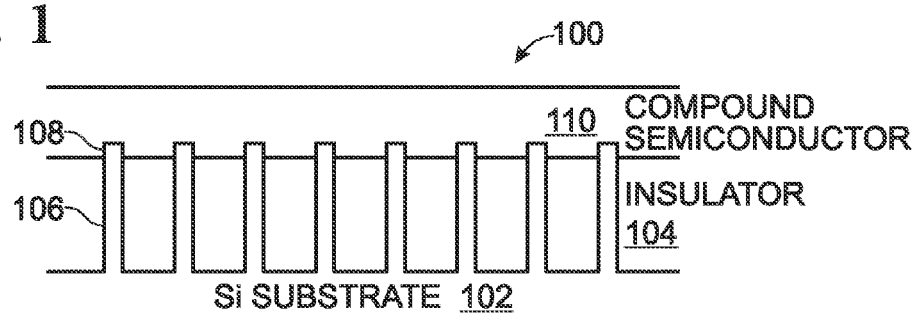
FIG. 1 is a partial cross-sectional view of a compound semiconductor-on-silicon (Si) wafer with a Si nanowire buffer layer.

FIG. 1 is a partial cross-sectional view of a compound semiconductor-on-silicon (Si) wafer with a Si nanowire buffer layer. The wafer 100 comprises a Si substrate 102. For example, the Si substrate 102 may have a (111) crystallographic orientation. An insulator layer 104 overlies the Si substrate 102, with Si nanowires 106. The Si nanowires 106 have compound semiconductor-coated tips 108. A compound semiconductor layer 110 overlies the insulator 104. While the invention has practical application to Si substrates, it is not limited to any particular type of underlying substrate material.

Figure 2:
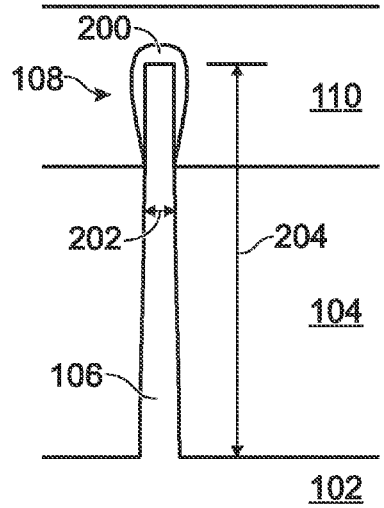
FIG. 2 is a detailed depiction of one of the Si nanowires of FIG. 1.

FIG. 2 is a detailed depiction of one of the Si nanowires of FIG. 1. Si nanowires 106 may alternately be referred to a Si nanotubes, nano-structures, or nanorods. In this detail, the Si nanowire tip can be seen coated with a compound semiconductor material 200. The Si nanowires 106 may have a diameter 202 in a range of about 5 nanometers (nm) to 500 nm, and an average length 204 in a range of about 0.2 micrometers (µm) to 3 µm. In one aspect, longer Si nanowires are desirable, as they provide more effective thermal stress relief.

Returning to FIG. 1, the Si nanowires 106 have a density per square micrometer ($\mu m^{-2}$) in the range of about 0.5 to 1000. The density is understood to be the average number of Si nanowires overlying a square-micrometer of substrate surface. In one aspect, the insulator layer 104 materials include silicon dioxide and $Si_xN_y$, where $x \leq 3$ and $Y \leq 4$. However, the wafer is not limited to any particular insulator. The compound semiconductor layer 110 can be a material such as GaN, GaAs, GaAlN, or SiC. However, the present invention Si nanowire buffer layer is not necessarily limited to just this list of materials.

In another aspect, the insulator layer 104 may be a thermally soft insulator (TSI) that has a liquid phase temperature lower than the liquid phase temperatures of Si 102 or the compound semiconductor 110. Typically, the TSI layer 104 has a flow temperature in the range of about 500° C. to 900° C., where the flow temperature is greater than the solid phase temperature and less than the liquid phase temperature. The TSI insulator layer 104 may be considered to be mechanically soft at the flow temperature, soft enough to isolate any differences in thermal expansion between the Si substrate 102 and the compound semiconductor 110. That is, the TSI layer 104 may be considered to be "soft" at the flow temperature.

The thermally soft insulator 104 may be a doped silicate glass material such as boronsilicate glass (BSG), phosphosilicate glass (PSG), or boronphosphosilicate glass (BPSG). Other materials may also be used that have a relatively low flow temperature. If the doped silicate glass material is BPSG, then it includes phosphorus in the range of about 2 to 4 atomic percentage (at %) and boron in the range of about 3 to 7 at %. If the doped silicate glass is PSG, then it includes phosphorus in the range of about 5 to 9 at %. If BSG, the doped silicate glass includes boron in the range of about 5 to 8 at %. The flow temperature of the TSI material can be varied by adjusting the above-mentioned doping ratios. Additional details of the TSI material are provided in pending parent application entitled, COMPOUND SEMICONDUCTOR-ON-SILICON WAFER WITH A THERMALLY SOFT INSULATOR, invented by Hsu et al., Ser. No. 11/443,144, filed May 30, 2006, which is incorporated herein by reference.

Figure 3:
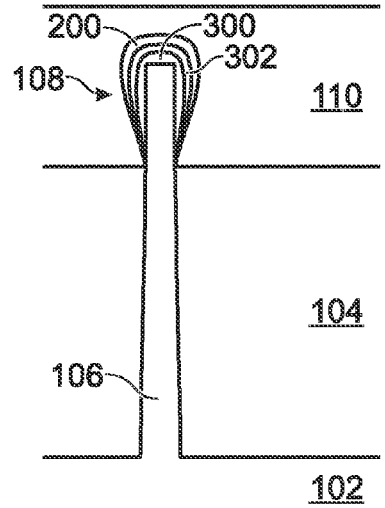
FIG. 3 is a detailed depiction, showing a variation of the Si nanowires of FIG. 1.

FIG. 3 is a detailed depiction, showing a variation of the Si nanowires of FIG. 1. In this aspect, the Si nanowire tip 108 include an initial carbonized layer 300, a SiC-coating 302 overlying the carbonized layer 300, and the compound semiconductor-coating 200 overlying the SiC coating 302.

Figure 4:
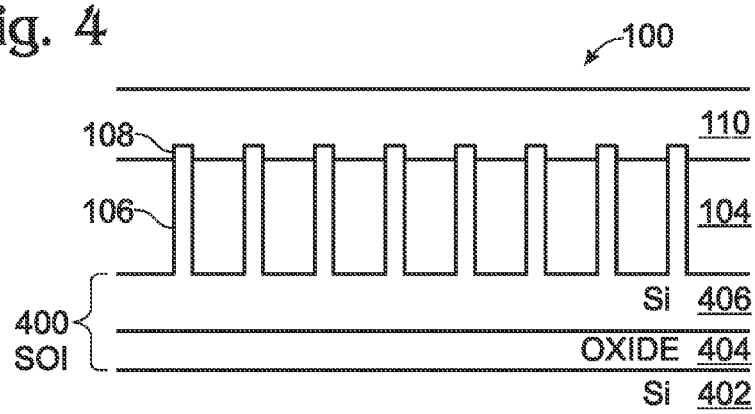
FIG. 4 is a partial cross-sectional view of a variation of the compound semiconductor-on-Si wafer with Si nanowire buffer layer.

FIG. 4 is a partial cross-sectional view of a variation of the compound semiconductor-on-Si wafer with Si nanowire buffer layer. The details of this wafer 100 are the same as presented in the explanations of FIGS. 1 through 3 above, except for the substrate. In this aspect, the Si substrate is a Si-on-insulator (SOI) substrate 400, with a Si substrate 402, an oxide insulator 404, overlying the substrate 402, and a Si layer 406, overlying the insulator 404.

Functional Description

Figure 5:
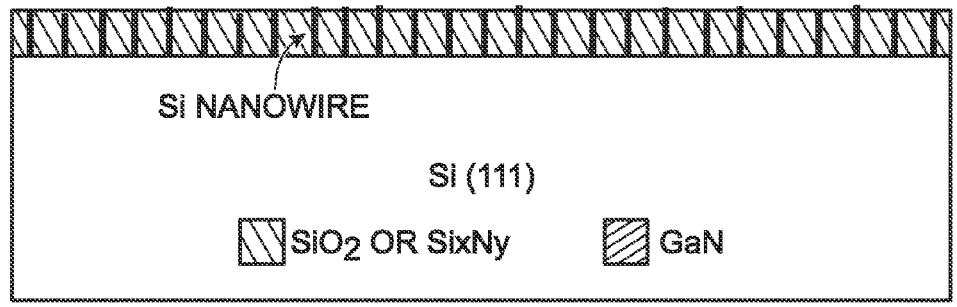
FIGS. 5 through 7 show steps in the completion of a compound semiconductor-on-Si wafer with a Si nanowire buffer layer.
Figure 6:
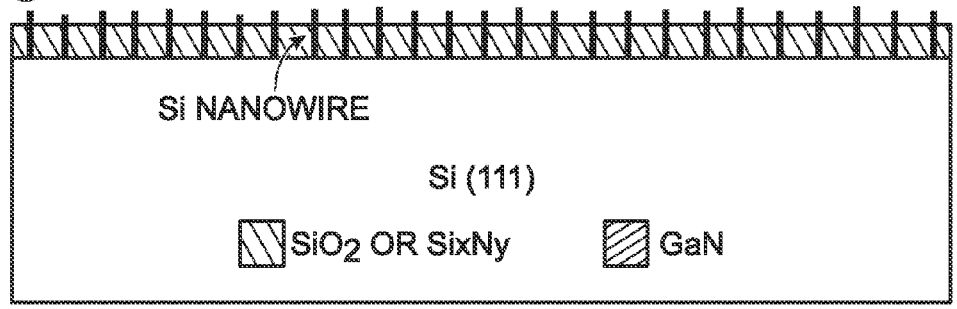
Figure 7:
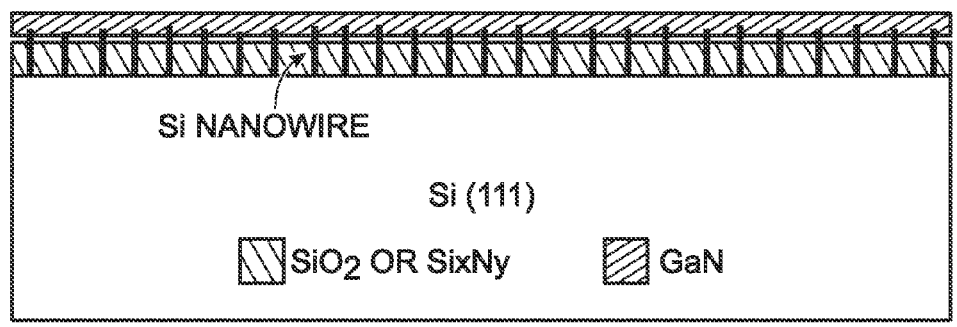

FIGS. 5 through 7 show steps in the completion of a compound semiconductor-on-Si wafer with a Si nanowire buffer layer. The fabrication processes for an exemplary GaN-on-Si is presented as follows.

1) The starting wafer is Si (111).

2) Si nanowires are prepared on the Si (111) wafer using etching or CVD deposition methods.

3) TSI, SiO2, or a $Si_xN_y$ insulator is deposited, and CMP is performed on the insulator to remove catalyst from the insulator top surface. The CMP stops on Si nanowires, as shown in FIG. 5.

4) The wafer is HF dip etched for a few seconds to expose top of Si nanowires, as shown in FIG. 6.

Figure 8A:
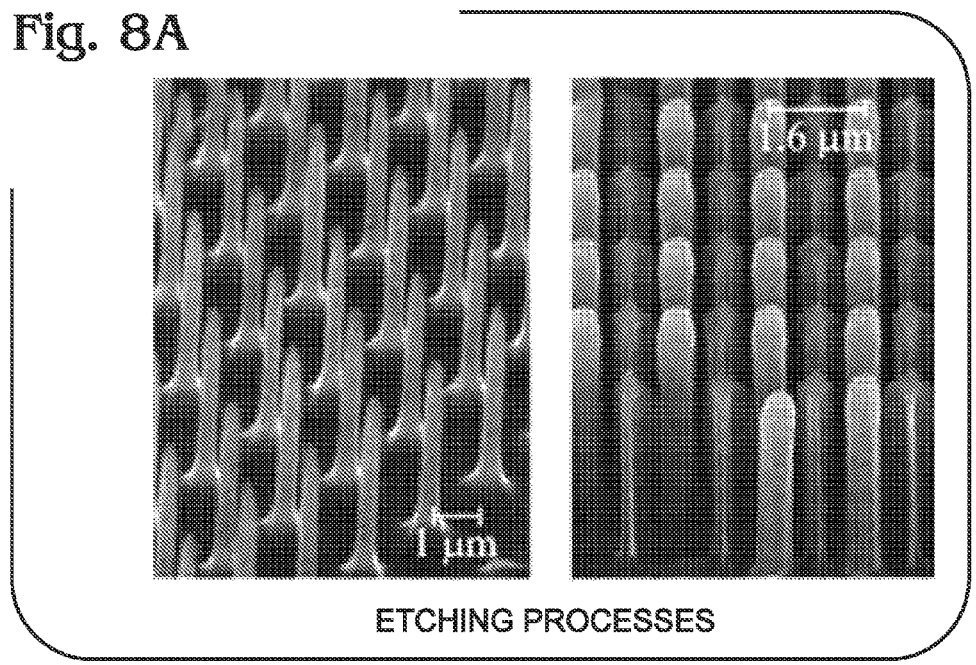
FIGS. 8A and 8B depict Si nanowires formed, respectively, by etching and CVD growth processes.
Figure 8B:
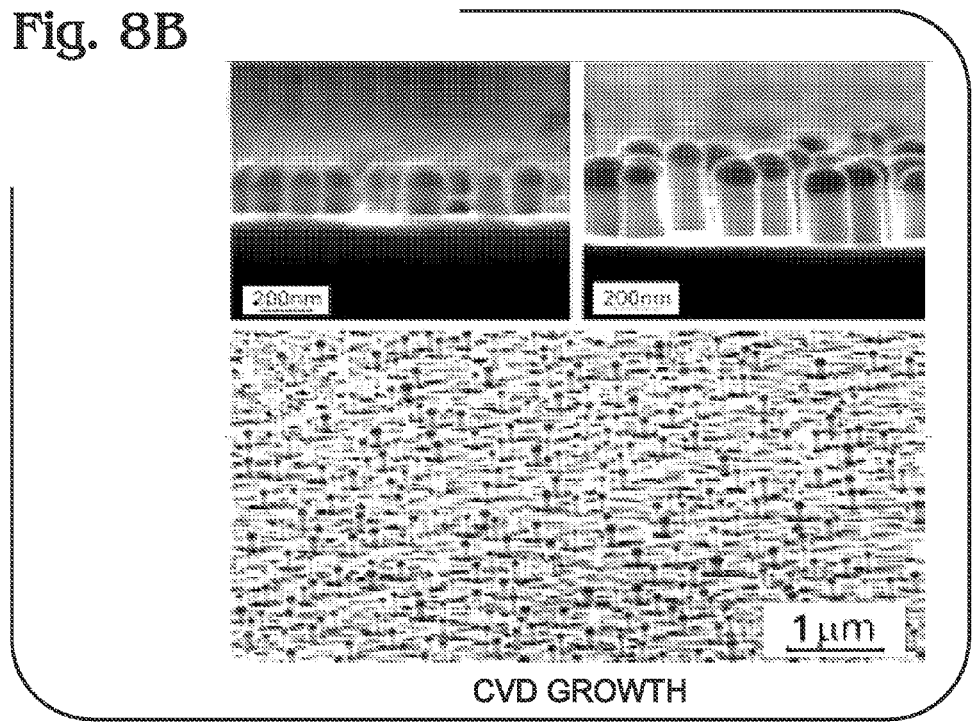

5) GaN is selectively deposited on the Si nanowires, and lateral epitaxial overgrowth (LEO) permits the coalescence of a crack-free, high quality GaN thick film, as shown in FIG. 7. LEO is a CVD deposition processes, in which the film selectively grown from island nuclear area FIGS. 8A and 8B depict Si nanowires formed, respectively, by etching and CVD growth processes.

A variation of the above-presented process is as follows.

1) The starting wafer is Si (111).

2) Si nanowires are prepared on the Si (111) wafer using etching or CVD deposition methods.

3) TSI, SiO2, or a SixNy is deposited, followed by a CMP to remove any catalyst from the insulator top surface, stopping on the Si nanowires.

4) The wafer is HF dip etched for a few seconds to expose the top of the Si nanowires.

5) The Si nanowires are carbonized and SiC is selectively deposited on the Si nanowires.

6) GaN is selectively deposited on the SiC-coated Si nanowires. The GaN layer is formed using the LEO process.

FIG. 9 is a flowchart illustrating a method for a compound semiconductor-on-Si wafer with a Si nanowire buffer layer. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 900.

Step 902 forms a Si substrate. As noted above, the Si substrate may have a (111) crystallographic orientation. In another aspect, the Si substrate is a SOI substrate. Step 904 forms an insulator layer overlying the Si substrate, with Si nanowires having exposed tips. Step 906 selectively deposits compound semiconductor on the Si nanowire tips. For example, the compound semiconductor can be deposited by MOCVD. The process is selective because compound semiconductor is more likely to form on the Si nanowire tips, than on the insulator surface. Step 908 uses a lateral epitaxial overgrowth (LEO) process to grow compound semiconductor from the compound semiconductor-coated Si nanowire tips. Step 910 forms a compound semiconductor layer overlying the insulator. The compound semiconductor layer may be made from a material such as GaN, GaAs, GaAlN, or SiC. However, the process is applicable to other compound semiconductor materials.

In one aspect, forming the insulator layer overlying the Si substrate, with Si nanowires having exposed tips, in Step 904 includes substeps. Step 904a forms Si nanowires overlying the Si substrate. For example, the Si nanowires can be formed by etching the Si substrate or by CVD. In one aspect, the Si nanowires have a diameter in a range of about 5 nm to 500 nm, a density per square micrometer ($\mu m^{-2}$) in the range of about 0.5 to 1000, and an average length in a range of about 0.2 $\mu m$ to 3 $\mu m$.

Step 904b deposits the insulator overlying the Si nanowires. As noted above, the insulator can be silicon dioxide or SixNy, where $X \leq 3$ and $Y \leq 4$, although other materials are also possible. Step 904c performs a CMP of the insulator top surface, stopping at Si nanowire tips. Step 904d etches the insulator top surface, to expose the Si nanowire tips. For example, the insulator top surface may be etched by dipping the top surface in HF.

In one aspect, Step 905a carbonizes the Si nanowire tips, and Step 905b selectively deposits SiC overlying the carbonized Si nanowire tips. Then, selectively depositing compound semiconductor on the Si nanowire tips in Step 906 includes selectively depositing compound semiconductor on the SiC-coated Si nanowire tips.

In another aspect, forming the insulator in Step 904 includes depositing a thermally soft insulator (TSI) material overlying the Si nanowires. The TSI material has a flow temperature in the range of about 500° C. to 900° C., where the flow temperature is greater than the solid phase temperature and less than the liquid phase temperature. For example, the thermally soft insulator may be a doped silicate glass material such as BSG, PSG, or BPSG.

A compound semiconductor-on-Si substrate with a Si nanowire buffer layer has been provided, along with a corresponding method of fabrication. Examples of specific layer orderings and materials have been given to illustrate the invention. Although the invention has been presented in the context of Si and GaN materials, the general principles are applicable to the thermal expansion mismatch between other materials. However, the invention is not limited to merely these examples. Other variations and embodiments of the invention will occur to those skilled in the art.

We claim:

1. A compound semiconductor-on-silicon (Si) wafer with a Si nanowire buffer layer, the wafer comprising:
    a Si substrate;
    an insulator layer overlying the Si substrate, with Si nanowires having compound semiconductor-coated tips; and,
    a compound semiconductor layer overlying the insulator.

2. The wafer of claim 1 wherein the Si substrate has a (111) crystallographic orientation.

3. The wafer of claim 1 wherein the insulator layer is a material selected from a group consisting of silicon dioxide and SixNy, where $x \leq 3$ and $Y \leq 4$.

4. The wafer of claim 1 wherein the Si nanowire tips include an initial carbonized layer, a SiC-coating overlying the carbonized layer, and the compound semiconductor-coating overlying the SiC coating.

5. The wafer of claim 1 wherein the compound semiconductor layer is a material selected from a group consisting of GaN, GaAs, GaAlN, and SiC.

6. The wafer of claim 1 wherein the Si substrate is a Si-on-insulator (SOI) substrate.

7. The wafer of claim 1 wherein the Si nanowires have a diameter in a range of about 5 nanometers (nm) to 500 nm, a density per square micrometer ($\mu m^{-2}$) in the range of about 0.5 to 1000, and an average length in a range of about 0.2 $\mu m$ to 3 $\mu m$.

8. The wafer of claim 1 wherein the insulator is a thermally soft insulator (TSI) material having a flow temperature in the range of about 500° C. to 900° C., where the flow temperature is greater than the solid phase temperature and less than the liquid phase temperature.

9. The wafer of claim 8 wherein the thermally soft insulator is a doped silicate glass material selected from a group consisting of boronsilicate glass (BSG), phosphosilicate glass (PSG), and boronphosphosilicate glass (BPSG).

* * * * *